United States Patent
Nag et al.

(10) Patent No.: US 6,962,883 B2
(45) Date of Patent: Nov. 8, 2005

(54) INTEGRATED CIRCUIT INSULATOR AND METHOD

(75) Inventors: Somnath S. Nag, Plano, TX (US); Girish A. Dixit, Plano, TX (US); Srikanth Krishnan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 97 days.

(21) Appl. No.: 10/634,413

(22) Filed: Aug. 5, 2003

(65) Prior Publication Data

US 2004/0259384 A1 Dec. 23, 2004

Related U.S. Application Data

(62) Division of application No. 08/692,887, filed on Aug. 1, 1996, now abandoned.

(51) Int. Cl.[7] .............................................. H01L 21/31
(52) U.S. Cl. ...................... 438/788; 438/778; 438/763
(58) Field of Search ................................ 438/788, 792, 438/626, 631, 645, 778, 763

(56) References Cited

U.S. PATENT DOCUMENTS

| 5,432,073 A | * | 7/1995 | Wu et al. .................... 438/624 |
| 5,705,405 A | * | 1/1998 | Cunningham ............... 438/157 |
| 5,707,486 A | | 1/1998 | Collins |
| 5,888,414 A | | 3/1999 | Collins et al. |

* cited by examiner

Primary Examiner—Kevin M. Picardat
(74) Attorney, Agent, or Firm—Carlton H. Hoel; W. James Brady, III; Frederick J. Telecky, Jr.

(57) ABSTRACT

A two-stage plasma enhance dielectric deposition with a first stage of low capacitively-coupled RF bias with conformal deposition (202) followed by high capacitively-coupled RF bias for planarizing deposition (204) limits the charge build up on the underlying structure (104, 106, 108).

4 Claims, 6 Drawing Sheets

INTEGRATED CIRCUIT INSULATOR AND METHOD

CROSS-REFERENCE TO RELATED APPLICATIONS

This application is a divisional of patent application Ser. No. 08/692,887, filed Aug. 1, 1996, now abandoned.

BACKGROUND OF THE INVENTION

The invention relates to semiconductor devices, and, more particularly, to integrated circuit insulation and methods of fabrication.

Integrated circuits typically include field effect transistors with source/drains formed in a silicon substrate and insulated gates on the substrate plus multiple overlying metal (or polysilicon) interconnection levels with an insulating layer between the gates/sources/drains and the first metal level (premetal dielectric) and between successive metal levels (intermetal-level dielectric). Vertical vias in the insulating layers filled with metal (or polysilicon) provide connections between adjacent metal levels and between the gate/source/drain and the first metal level. Each insulating layer must cover the relatively bumpy topography of a metal level or the gates and field oxide, and the insulating layer must have a planar top surface for ease in formation of the next level metal. Consquently, various approaches to forming planar insulating layers over bumpy topography have been developed: reflowing deposited borophosphosilicate glass (BPSG), using spin-on glass (SOG), sputering while depositing in plasma enhanced chemical vapor deposition (PECVD) with tetraethoxysilane (TEOS), and etching back a stack of deposited glass plus spun-on planarizing photoresist.

These approaches have problems including the multiple steps required for fabrication of the insulating layer and gate dielectric breakdown from gate exposure to a plasma during PECVD TEOS used for premetal dielectric.

Laxman, Low ∈ Dielectrics: CVD Fluorinated Silicon Dioxides, 18 Semiconductor International 71 (May 1995), summarizes reports of fluorinated silicon dioxide for use as an intermetal level dielectric which has a dielectric constant lower than that of silicon dioxide (3.9). In particular, PECVD using silicon tetrafluoride ($SiF_4$), silane ($SiH_4$), and oxygen ($O_2$) source gasses can deposit $SiO_XF_Y$ with up to 10% fluorine and a dielectric constant down towards 3.0.

SUMMARY OF THE INVENTION

The present invention provides a planarizing two-stage deposition of premetal dielectric with plasma enhancement: a first low bias deposition to eliminate charge buildup and/or physical damage of transistor gate dielectric followed by a second high bias deposition for planarization.

Advantages include a single, short deposition process with varying plasma to substrate bias to form a planarized insulating layer even on charge sensitive structures such as gates. This provides cycle-time and cost savings and potential for yield improvement due to the short process time.

BRIEF DESCRIPTION OF THE DRAWINGS

The drawings are schematic for clarity.

DESCRIPTION OF THE PREFERRED EMBODIMENTS

First Preferred Embodiment

Figure 1A:
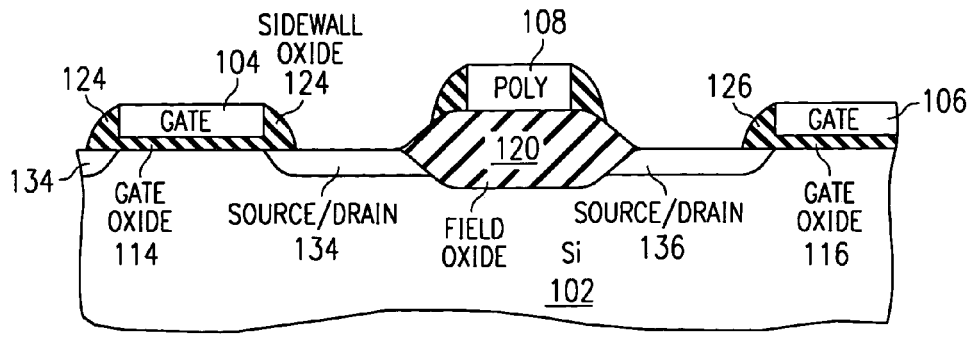
FIGS. 1a–e show in cross-sectional elevation views a known premetal dielectric fabrication method.
Figure 1B:
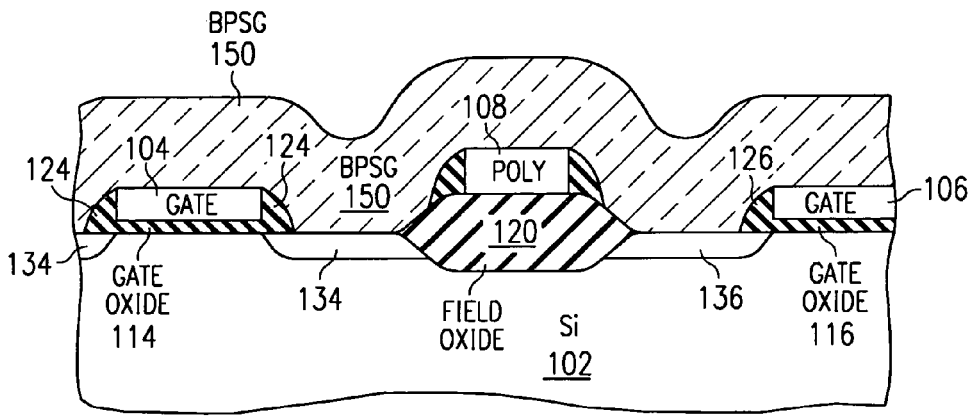
Figure 1C:
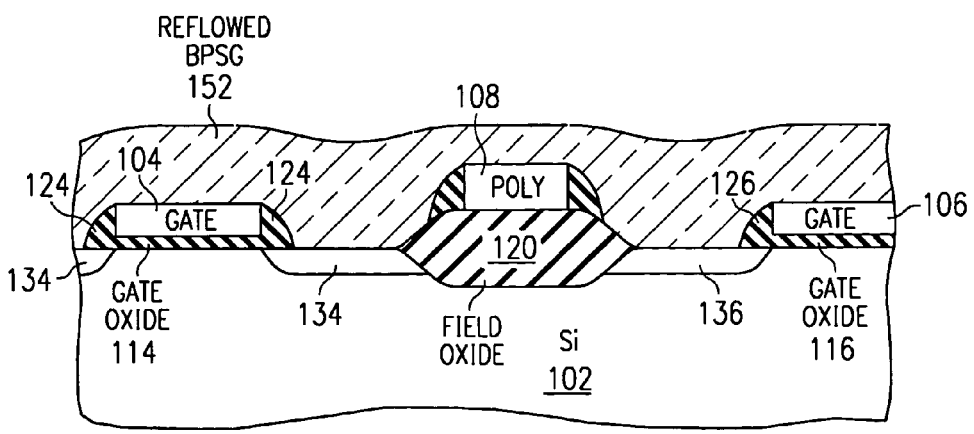

To order to explain the first preferred embodiment premetal dielectric layer fabrication, first consider a known method of fabrication. In particular, FIG. 1a shows in cross sectional elevation view a portion of a silicon substrate 102 with polysilicon gates 104–106 on gate insulator silicon dioxide (gate oxide) 114–116 and having sidewall oxides 124–126 for alignment of source/drains 134–136 and with the transistors separated by field oxide 120 with polysilicon line 108 running over field oxide 120. Typically, the polysilicon gates and the field oxide extend about 0.3 $\mu$m above the substrate surface, so the top of polysilicon line 108 lies about 0.6 $\mu$m above the substrate surface. Gate oxide 114–116 may be about 6 nm thick. A somewhat planar insulating layer to cover the gates and field oxide then can be formed as follows. First, deposit layer 150 of borophosphosilicate glass (BPSG, roughly 5% boron and 5% phosphorus) about 1 $\mu$m thick by plasma enhanced chemical vapor deposition; see FIG. 1b. Then heat the BPSG to about 900° C. for 20 minutes, and it flows (surface tension pulls down projections and fills in depressions) and densifies to form reflowed BPSG 152 with a smoothed planarized surface as shown in FIG. 1c.

For a more planar surface than that of reflowed BPSG 152, chemical-mechanically polish reflowed BPSG 152 to thin and planarize it, and then deposit another layer of BPSG and reflow/densify it.

Figure 1D:
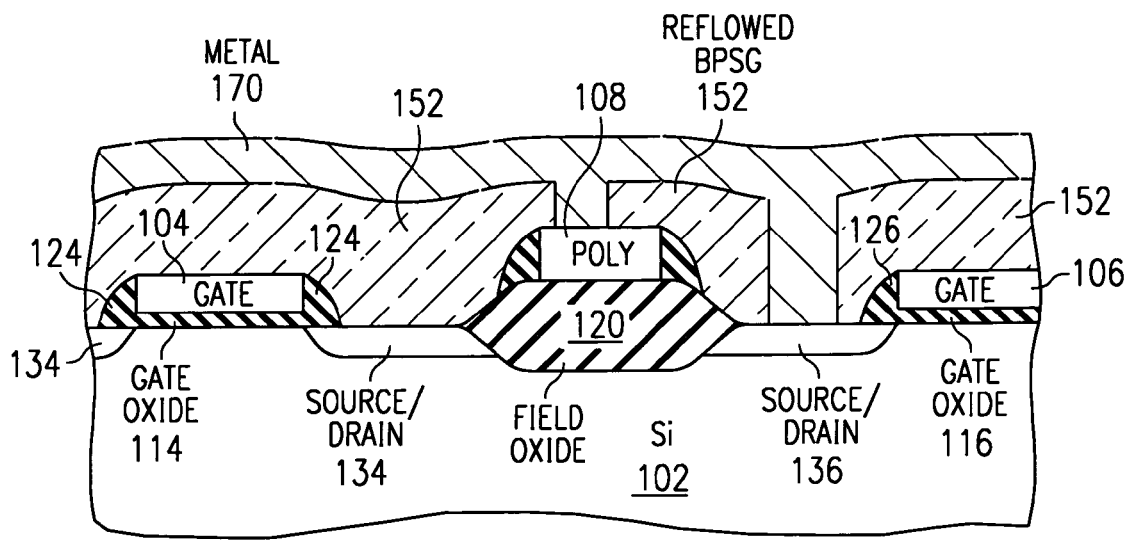
Figure 1E:
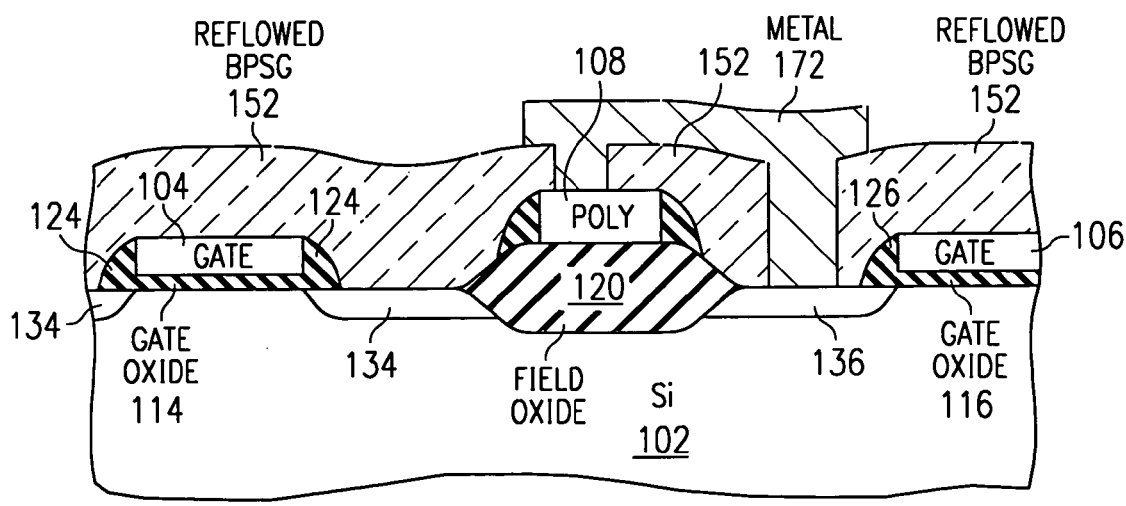

Once planarized insulating layer 152 has been formed covering gates 104–106 and polysilicon line 108, photolithographically pattern and etch vias in layer 152 for any desired connections down to gates 104–106 or polysilicon line 108 or source/drains 134–136. Next, deposit a layer of metal 170 which also fills the vias with metal such as by chemical vapor deposition (CVD) of tungsten on a sputtered titanium nitride adhesion layer; see FIG. 1d.

Photolithographically pattern and etch metal layer 170 to form first level metal interconnections 172. This again leaves discontinuities in the surface which a planarized intermetal level dielectric layer must cover in order to support a second level of metal interconnections.

BPSG 152 has the following functions: (1) electrically insulates gates and polysilicon lines from first level metal interconnects; (2) getter mobile ions diffusing down towards gates 104–106 and source/drains 134–136; and (3) present a planar surface for first level metal interconnection formation. The boron and phosphorus in the BPSG perform the gettering functions and prevent mobile ions from reaching the transistors and degrading their performance. The insulating layer between first level metal interconnections and second level metal interconnections must also provide electrical insulation and presents a planar surface; however, such inter-metal-level insulation need not getter mobile ions.

Figure 2A:
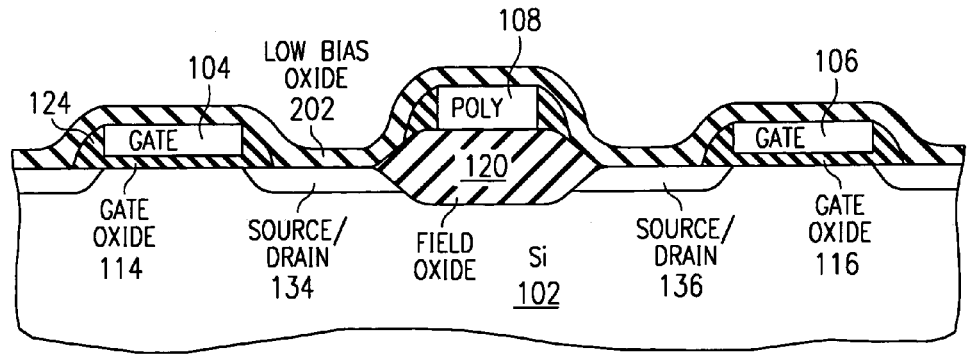
FIGS. 2a–c illustrate in cross-sectional elevation views a first preferred embodiment method.
Figure 2B:
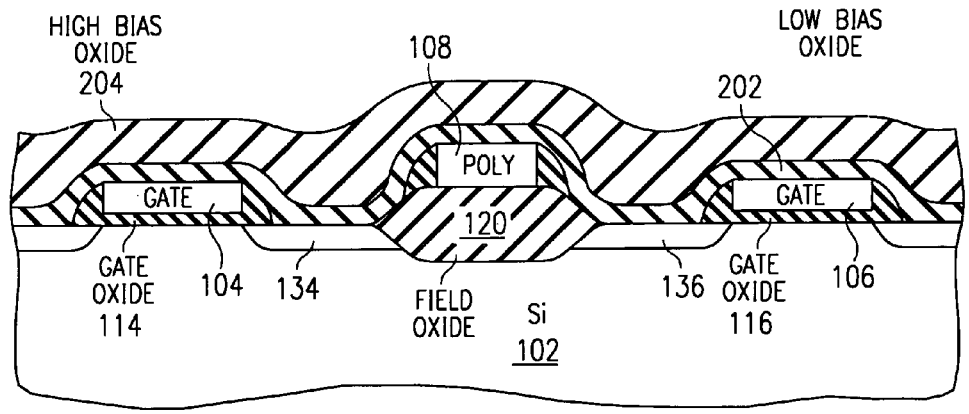
Figure 2C:
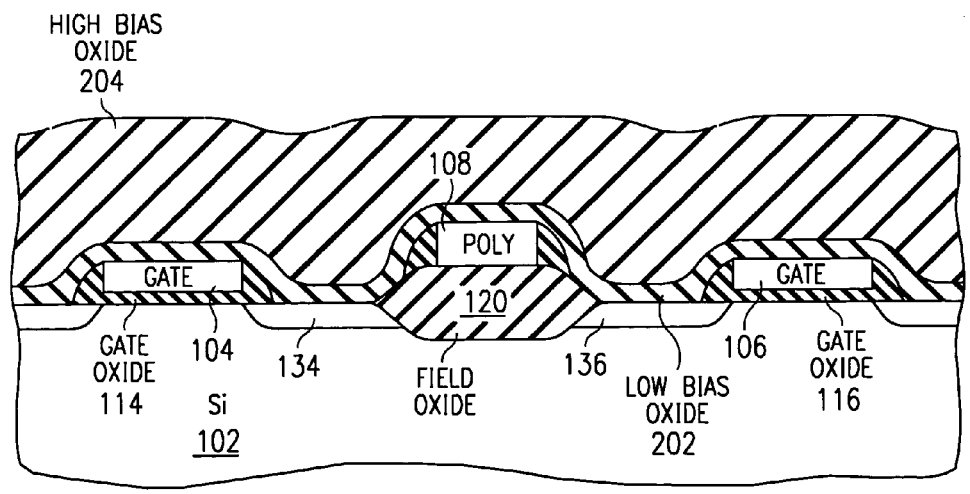
Figure 3:
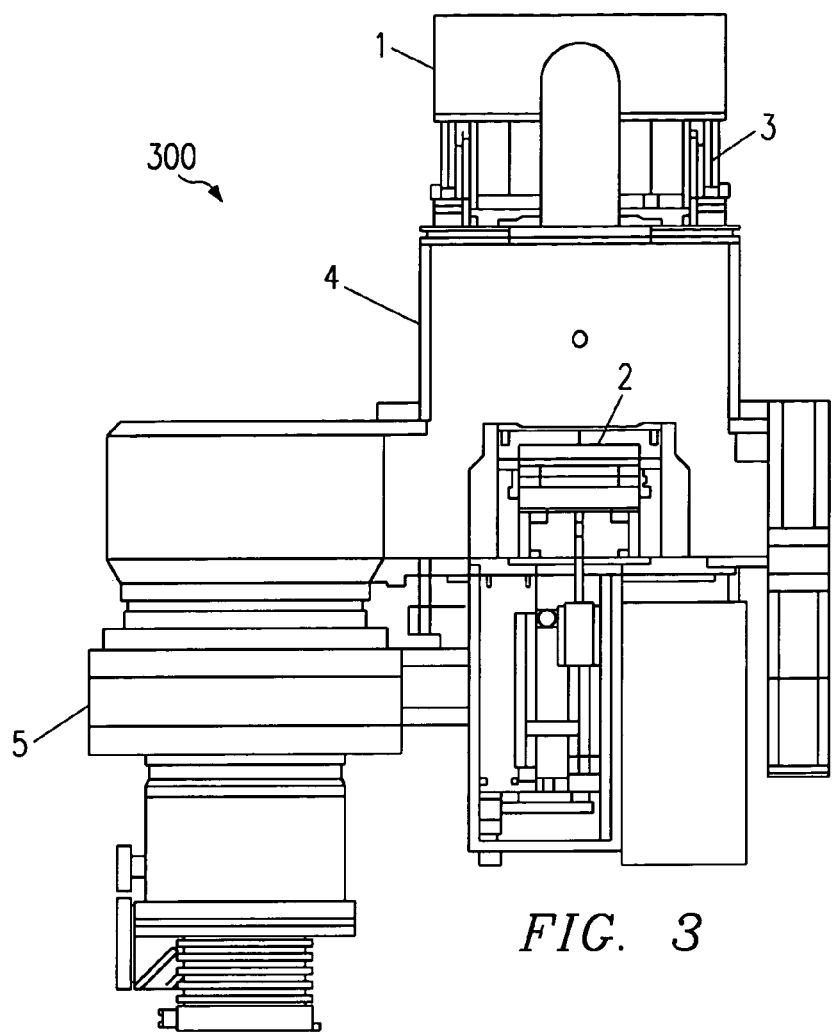
FIG. 3 shows a high density plasma reactor.

The first preferred embodiment method of forming a planarized premetal dielectric layer over the gates and polysilicon lines includes the following steps as illustrated in FIGS. 2a–c:

(1) Start with a substrate having polysilicon gates 104–106, polysilicon lines 108, and source/drains 134–136 as in FIG. 1a; and insert the substrate into high-density plasma reactor 300, such as illustrated in FIG. 3. Then deposit 0.15 μm of oxide by plasma-enhanced deposition using source gasses silane and oxygen or nitrous oxide plus argon carrier gas. The reactions are:

$$SiH_4 + 2O_2 \rightarrow SiO_2 + 2H_2O$$

$$SiH_4 + 2N_2O \rightarrow SiO_2 + 2H_2 + 2N_2$$

and plasma heating increases the substrate temperature which is held at about 330° C. The total pressure in the reaction chamber is about 5–10 mTorr; but despite the low pressure, the ion density is about $10^{13}/cm^3$ for reactor 300 and the oxide deposits at a rapid rate. The high ion density derives from the inductive coupling of rf source 1 with the feed gasses rather than the traditional capacitive coupling. The inductive coupling in reactor 300 allows adjustment of the bias RF capacitive voltage (which determines plasma potential for ion bombardment of the substate) between the plasma and the substrate on chuck 2 without affecting the plasma density. Set the bias close to 0 volts; this deters the antenna formed by polysilicon gates 104–106 and polysilicon lines 108 from collecting sufficient electric charge (due to nonuniformities in the plasma) to create large electric fields across gate oxides 114–116 and consequent oxide damage and degration in transistor performance. Of course, deposition with no bias yields a conformal layer of oxide 202 as illustrated in FIG. 2a. Any low bias will limit charge accumulation, so the bias may be varied according other process requirements.

(2) Continue the plasma-enhanced oxide deposition but switch on the power to chuck 2 to change the capacitive RF bias from plasma to substrate to about 600 volts so that ions from the plasma bombard the oxide 204 being deposited with energies on the order of several hundred electron volts. This sputters material from protruding portions of the growing oxide 204 and thus increasingly smoothes oxide 204 as it grows. See FIG. 2b illustrating 0.15 μm thick oxide 202 deposited with no bias and 0.5 μm thick oxide 204 deposited with 600 volt bias.

(3) Complete the plasma-enhanced oxide deposition when oxide 204 deposited with the dc bias of 600 volts reaches an average thickness of about 1.0 μm and the total oxide thickness about 1.15 μm. See FIG. 2c.

(4) The gettering aspect of BPSG 152 can be retained by adding $PH_3$ to the source gasses to provide phosporus doping of either low-bias deposited oxide 202 or high-bias deposited oxide 204 or both. Similarly, addition of $B_2H_6$ will provide boron doping, or addition of both $PH_3$ and $B_2H_6$ will yield BPSG.

(5) Optionally, increase the planarity of the surface of oxide 204 of FIG. 2c by applying chemical-mechanical polishing followed by another deposition of oxide to compensate for the thinning by the chemical-mechanical polishing.

FIG. 3 shows reactor 300 in cross sectional elevation view as including high density plasma (HDP) source 1 powered by an RF generator with a maximum of 3500 watts output, movable chuck 2 for holding substrates with helium backside gas feed for wafer temperature stability during processing, chuck 2 is powered by a capacitive RF generator with a maximum of 2000 watts output. Chuck 2 can hold a single 8 inch diameter wafer. Feed gasses enter chamber 4 from below chuck 2 and pump 5 removes reaction products.

Control of the RF power to HDP source 1 controls the plasma density, and control of the RF power to chuck 2 controls the bias developed between the plasma and the substrate and thus controls the ion energy for ions bombarding the substrate. The RF power to chuck 2 is small for the low bias deposition initial portion of the first preferred embodiment method and increases for the high bias deposition final portion.

Figure 4A:
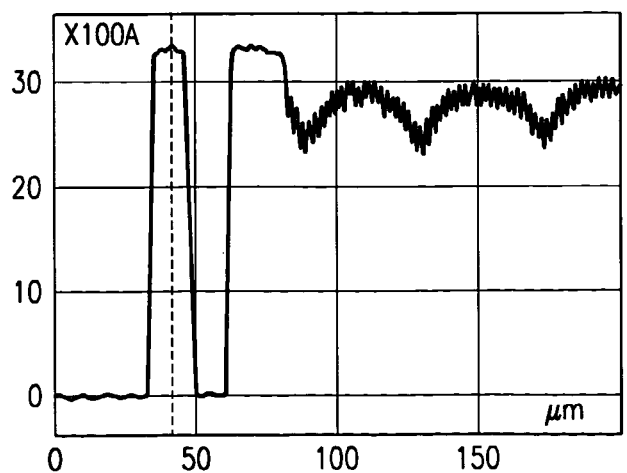
FIGS. 4a–d and 5 illustrate experimental results of the first preferred embodiment.
Figure 4B:
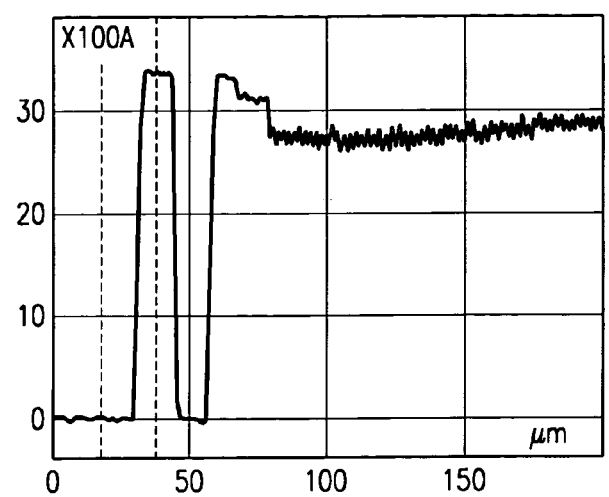
Figure 4C:
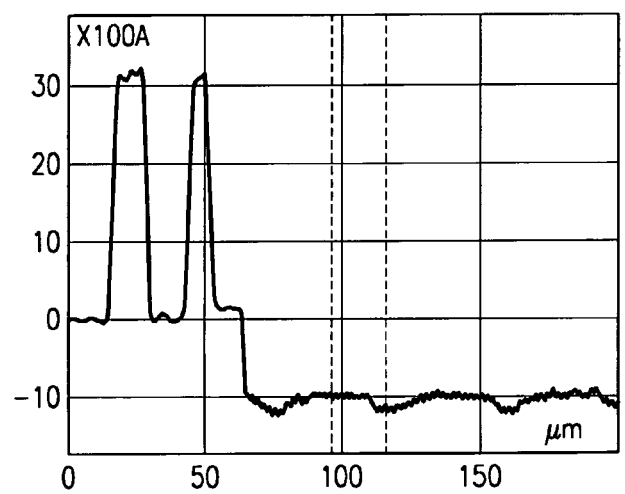
Figure 4D:
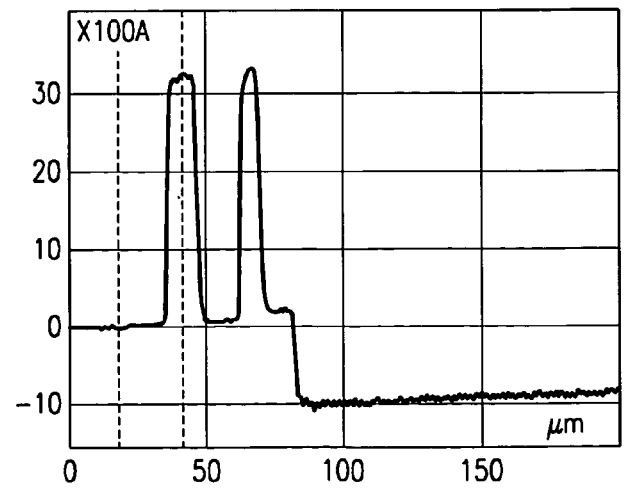

FIGS. 4a–d illustrate the first preferred embodiment smoothing. In particular, FIG. 4a shows a profilimeter tracing of three adjacent rounded features (analogous to a gate with sidewall spacers) each about 43 μm wide and 0.05 μm high; FIG. 4b the same tracing after a BPSG deposition and reflow; FIG. 4c after a 0.15 μm deposition at low bias followed by a 0.85 μm deposition at a high bias with a ratio of deposition rate to sputter rate of about 3.25; and FIG. 4d after a 0.15 μm deposition at low bias followed by a 0.85 μm deposition at a high bias with a ratio of deposition rate to sputter rate of about 2.9. The greater planarization in FIG. 4d reflects a larger high bias with its greater sputtering.

Figure 5:
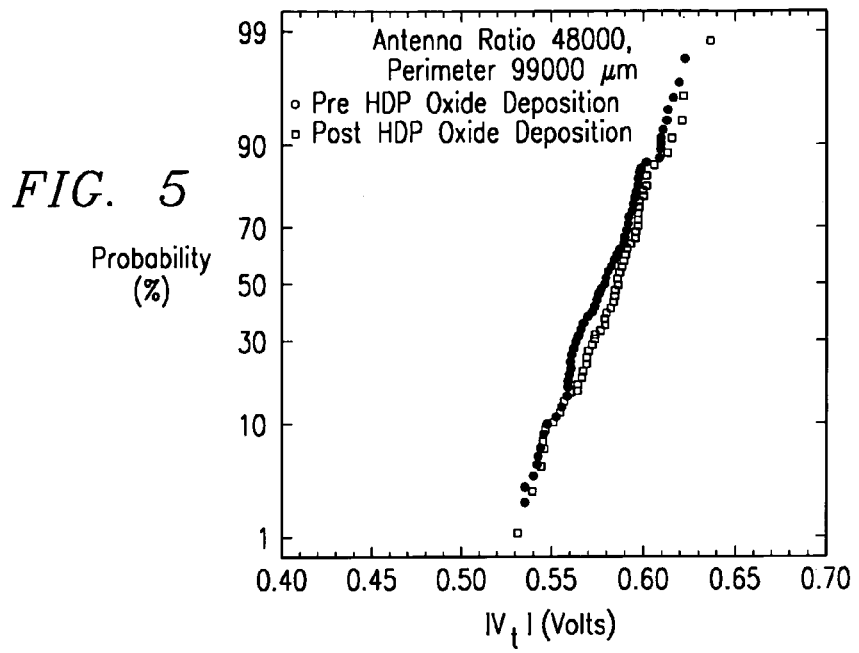

FIG. 5 illustrates the effect of the first preferred embodiment PMD on the cumulative probability distribution of threshold voltage of the insulated gate transistors covered by PMD for the case of a large antenna ratio. In particular, the first preferred embodiment produces negligible change in the threshold voltage which confirms a lack of degradation of transistor characteristics.

Fluorinated Oxide Preferred Embodiment

A second preferred embodiment method of forming the premetal dielectric follows the steps of the first preferred embodiment but deposits fluorinated silicon oxide ($SiO_XF_Y$) dielectric. The addition of fluorine provides gettering of mobile cations plus decreases the dielectric constant due to the lower polarizability of the Si—F bond as compared to the Si—O bond. In particular, the following steps produce a fluorinated oxide first conformal layer followed by a planarizing oxide layer:

(1) Start with a substrate having polysilicon gates 104–106, polysilicon lines 108, and source/drains 134–136 as in FIG. 1a; and insert the substrate into high-density plasma reactor 300. Plasma heating increases the substrate temperature, which is held to 300° C. Then deposit 0.15 μm of fluorinated oxide by plasma-enhanced deposition using source gasses silane, oxygen, and silicon tetrafluoride plus argon carrier gas. The reaction is $$SiH_4 + O_2 + SiF_4 \rightarrow SiO_XF_Y + H_2O + HF + \ldots$$

Figure 6A:
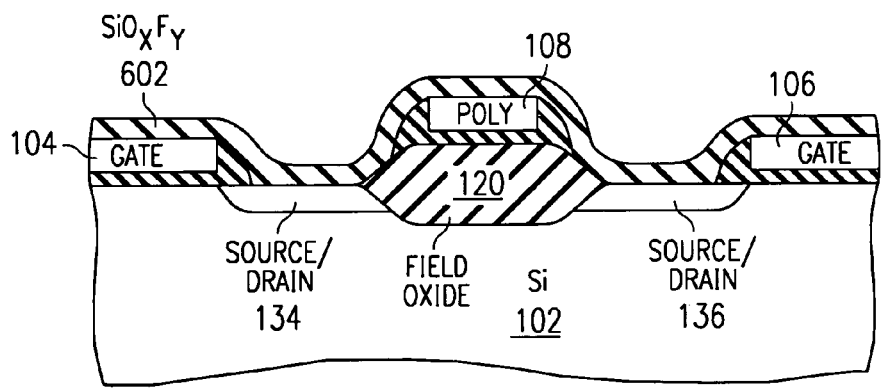
FIGS. 6a–b illustrate in cross-sectional elevation views a second preferred embodiment method.

The total pressure in the reaction chamber is about 5–10 mTorr. The fluorinated oxide deposits at about the same rate as the conformal $SiO_2$ of the first preferred embodiment. Set the plasma to substrate bias to about 0 volts; again this limits the antenna formed by polysilicon gates 104–106 and polysilicon lines 108 from collecting sufficient electric charge to create large electric fields across gate oxides and consequent gate oxide damage and degration in transistor performance. Further, fluorine at the interface of the gate oxide and the substrate helps passivate dangling silicon bonds and improves transistor performance. This deposition with no bias yields a conformal layer of fluorinated oxide 602 as illustrated in FIG. 6a.

Figure 6B:
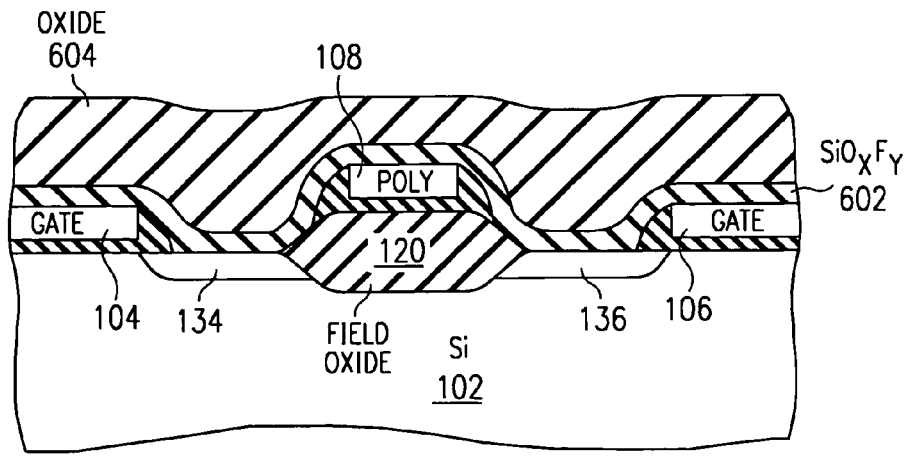

(2) Continue the plasma-enhanced deposition but stop the $SiF_4$ flow in order to deposit only oxide 604 and change the plasma to substrate dc bias to 600 volts to planarize the oxide 604 as deposits. See FIG. 6b illustrating 0.15 μm thick fluorinated oxide 602 deposited with no bias and 1.0 μm thick oxide 604 deposited with 600 volt bias. Making both the low bias and the high bias layers from fluorinated oxide takes maximum advantage of the low stress and low dielectric constant of fluorinated oxide.

(3) Optionally, increase gettering by addition of $PH_3$ to the source gasses to provide phosporus doping of either low-bias deposited fluorinated oxide 602 or high-bias deposited oxide 604 or both. Similarly, addition of $B_2H_6$ will provide boron doping.

(4) Optionally, increase the planarity of the surface of oxide 404 of FIG. 4*b* by applying chemical-mechanical polishing followed by another deposition of oxide or fluorinated oxide to compensate for the thinning by the chemical-mechanical polishing.

Modifications

The preferred embodiments may be varied in many ways while retaining one or more of the features of low bias deposition for limiting charge build up followed by high bias deposition for planarization plus fluorine doped deposition.

For example, the plasma-to-substrate bias voltages could be varied such as a nonzero low bias (e.g., less than about 150 volts) and a different high bias (e.g., greater than about 300 volts). Further, the bias could be ramped up from the low bias to the high bias in many steps or continuously during the deposition. The low bias that can be tolerated depends upon the antenna ratio (ratio of polysilicon gate area to total polysilicon line area) and plasma nonuniformity, so the low bias could be adjusted according to the circuit design type on the substrate. Similarly, increasing the high bias increases the sputtering and hence lowers net deposition rate, so select the high bias just high enough for sufficient planarity. The source gasses for the oxide and fluorinated oxide could be varied and include TEOS, silane, dichlorosilane, nitrous oxide, $CF_4$, $C_2F_6$, $NF_3$, and so forth. The thicknesses of the layers could be varied. The deposition with initial low bias followed by planarizing high bias also applies to plasma enhanced depositions of other dielectrics such as silicon nitride, silicon oxynitride, and so forth.

What is claimed is:

1. A method of premetal dielectric fabrication for an integrated circuit, comprising the steps of:
    (a) providing a substrate with insulated gate structures at a first surface; and
    (b) plasma-enhanced depositing a dielectric layer over said gates and substrate with a plasma-to-substrate bias initially less than a first threshold voltage but increasing to greater than a second threshold voltage which exceeds said first threshold voltage;
    (c) wherein said first threshold voltage is characterized by conformal deposition and said second threshold voltage is characterized by planarizing deposition.
2. The method of claim 1, wherein:
    (a) said dielectric layer is made of silicon oxides.
3. The method of claim 2, wherein:
    (a) said silicon oxides include dopants in at least a portion remote from said gate structures and substrate.
4. The method of claim 2, wherein:
    (a) said silicon oxides include dopants in at least a portion adjacent said gate structures and substrate.

* * * * *